United States Patent
Cooper et al.

(10) Patent No.: US 10,930,513 B1
(45) Date of Patent: Feb. 23, 2021

(54) METHOD OF PRODUCING SILICON ELEMENTS AND INTEGRATED CIRCUITS

(71) Applicant: UNIVERSAL PHOTONICS, INC, Central Islip, NY (US)

(72) Inventors: Alex Cooper, Brooklyn, NY (US); Gene Bederak, New Rochelle, NY (US); Richard Nastasi, Commack, NY (US); Panagiotis Orkopulos, Elmhurst, NY (US)

(73) Assignee: Unitool Consulting Co., New Rochelle, NY (US)

( * ) Notice: Subject to any disclaimer, the term of this patent is extended or adjusted under 35 U.S.C. 154(b) by 0 days.

(21) Appl. No.: 16/659,094

(22) Filed: Oct. 21, 2019

(51) Int. Cl.
   *H01L 21/304* (2006.01)
   *H01L 21/02* (2006.01)
   *B24B 9/06* (2006.01)

(52) U.S. Cl.
   CPC .... *H01L 21/3043* (2013.01); *H01L 21/02021* (2013.01); *B24B 9/065* (2013.01)

(58) Field of Classification Search
   CPC ....... H01L 21/02013; H01L 21/02008–02021; H01L 21/02005; B24B 9/065; B24B 9/06; B24B 5/04–047; B24B 27/003; B24D 5/00
   See application file for complete search history.

(56) References Cited

U.S. PATENT DOCUMENTS

| | | | | |
|---|---|---|---|---|
| 2003/0207657 | A1* | 11/2003 | Domanski | B24B 33/081 451/482 |
| 2010/0041320 | A1* | 2/2010 | Bankovic | B24B 33/06 451/47 |
| 2015/0183075 | A1* | 7/2015 | Huang | B24B 5/38 451/194 |
| 2016/0096248 | A1* | 4/2016 | Hicks | C30B 33/00 428/580 |

\* cited by examiner

*Primary Examiner* — Alia Sabur
(74) *Attorney, Agent, or Firm* — Henry M. Feiereisen LLC

(57) ABSTRACT

In a method of manufacturing silicon elements a part having a cross section with four straight sides and four arcuate portions each connecting two of the straight skies with one another and a rotatable abrasive tool which has a circular abrasive working layer composed of abrasive particles are provided, the tool is rotated around a central axis of the part having a cross section with the four straight sides and the four arcuate portions each connecting two of the straight sides with one another, in contact with the four arcuate portions with simultaneous displacement of the tool along an axis of the part to remove outer layers of the outer portions and to finely machine underlying arcuate surfaces of the part, and the part is cut transversely to produce silicone elements.

5 Claims, 6 Drawing Sheets

METHOD OF PRODUCING SILICON ELEMENTS AND INTEGRATED CIRCUITS

BACKGROUND OF THE INVENTION

The present invention generally relates to methods of producing silicon elements, for example for solar panels and also integrated circuit, with the use of abrasive tools.

Silicon elements for example for solar panels or integrated circuits are produced from parts which are made from circular ingots and have a cross section with four straight sides and four arcuate portions each connecting two of the straight sides with one another. The thusly produced parts are cut transversely to their axes to make thin silicon elements which are used for manufacturing of solar panels or integrated circuits. With known methods used for such production an initial cylindrical ingot is utilized, from which four circular side segments are cut off, thus producing a part which has four straight sides and four arcuate portions each connecting two of the straight sides with one another, and subsequently, the four arcuate portions are machined to make them concentric to a single center and to obtain a high surface quality. Then the silicon elements are made by transverse cutting of the thusly machined parts.

These methods are disclosed for example in RU 2186887C2, RU 2682564C1, JP2009233794A. In the known methods each of the arcuate portions of the parts are machined separately, and therefore it is exceptionally difficult to finally obtain all outer arcuate surfaces which have the same radius and are strictly concentric with respect to the same center % Moreover a normal component of a cutting force in this process is directed perpendicularly to an enveloping line and inwardly toward a center of the part and as a result creates damaged layers with microcracks which during subsequent thermal treatments can propagate toward a center of the part that cannot be used later.

When a normal component of a cutting force is directed parallel to an enveloping curve of the ingot and not inwardly of the ingot as in the applicant's invention, only insignificant minimum destruction of the surfaced of the ingot takes place, and this guarantees a high quality of the ingot that is ready to be cut into silicon elements, and as a result a high quality of the silicon elements.

SUMMARY OF THE INVENTION

Accordingly, it is an object of the present invention to provide a method of producing silicon elements for solar panels and integrated circuits, with the use of abrasive tools, which avoids the disadvantages of the prior art.

In keeping with these objects and with others which will become apparent hereinafter, a method of producing silicon elements, for example for solar panels or integrated circuits, is proposed, including the steps of manufacturing a part produced from a circular ingot and having a cross section with four straight sides and four arcuate portions each connecting two of the straight sides with one another, providing a rotatable abrasive tool which has an circular abrasive working layer, and rotating the tool concentrically around a central axis of the part having a cross section with four straight sides and four arcuate portions each connecting two of the straight sides with one another, in contact with the four arcuate portions each connecting two of the straight sides with one another, with simultaneous displacement of the tool along an axis of the part so as to simultaneously remove outer layers of the arcuate portions and finely machine underlying surfaces of the part, and thereafter cutting the part transversely perpendicular to its axis to produce substantially flat silicon elements.

According to another features of the present invention the providing the rotatable abrasive tool with a circular working layer includes using the circular working layer with an inner diameter which is smaller than the outer diameter of the arcuate portions of the part in order to remove the outer layers of the arcuate portions and finally machine the underlying surfaces.

According a further feature of the method of the present invention, a plurality of the rotatable abrasive tools are provided on a first support and a plurality of the parts are provided on a second support, so that during rotation of the plurality of the abrasive tools the arcuate portions of the parts are machined simultaneously, for subsequent transversely cutting of each of the parts and forming a plurality of silicon elements, for example for solar panels or integrated circuits.

According a further feature of the method of the present invention, during the machining of the parts provided on the second support by the plurality of the rotatable abrasive tools provided on the first support some of the abrasive tools are rotated in one rotary direction which others of the tools are rotated in another opposite rotary direction.

The novel features of the present invention are set forth in particular in the appended claims.

The invention itself, as to its construction and method of operation, will be best understood from the following description of the preferred embodiments which is accompanied by the following drawings.

DESCRIPTION OF THE PREFERRED EMBODIMENTS

The present invention relates a method of manufacturing of silicon elements, for example for use in solar panels or integrated circuits, which initially utilizes circular ingots for subsequent making of such silicon elements.

Figure 1:
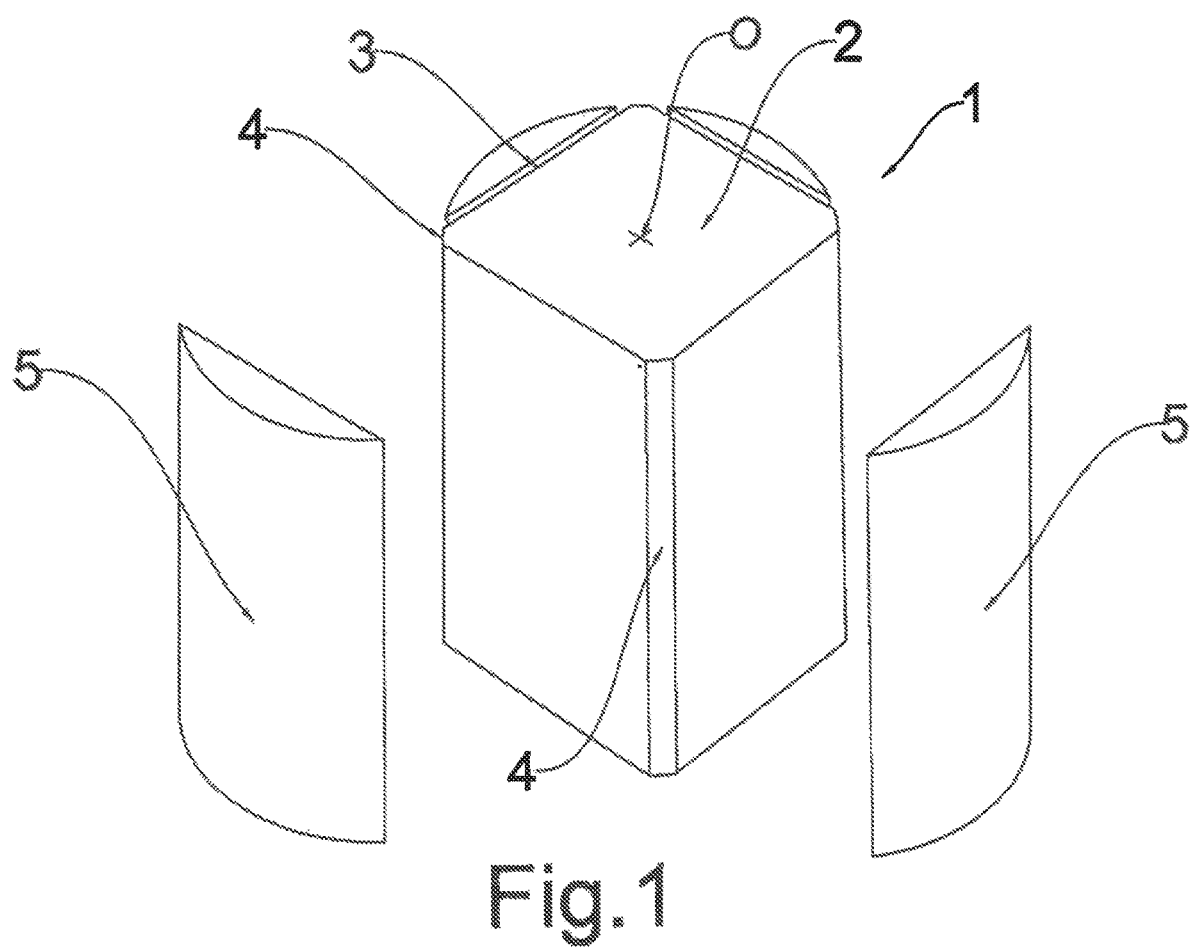
FIG. 1 of the drawings is a view showing a cross section of a circular ingot from which a part is produced for making silicon elements, for example for solar panels or integrated circuits according to the present invention.

One of such ingots identified with reference numeral 1 is shown in FIG. 1 of the drawings. It is used to produce a part 2 with a cross section having four straight surfaces 3 and four arcuate surfaces 4 each connecting two of the straight surfaces 3 with one another.

In order to produce the part 2 from the ingot 1 circular segments 5 are initially removed from the ingot 1 by known tools, for example by cutters which move along the axis of the ingot 1. As a result, the part 2 is produced with a cross section having the above-mentioned four straight surfaces 3 and four arcuate surfaces 4.

Figure 2:
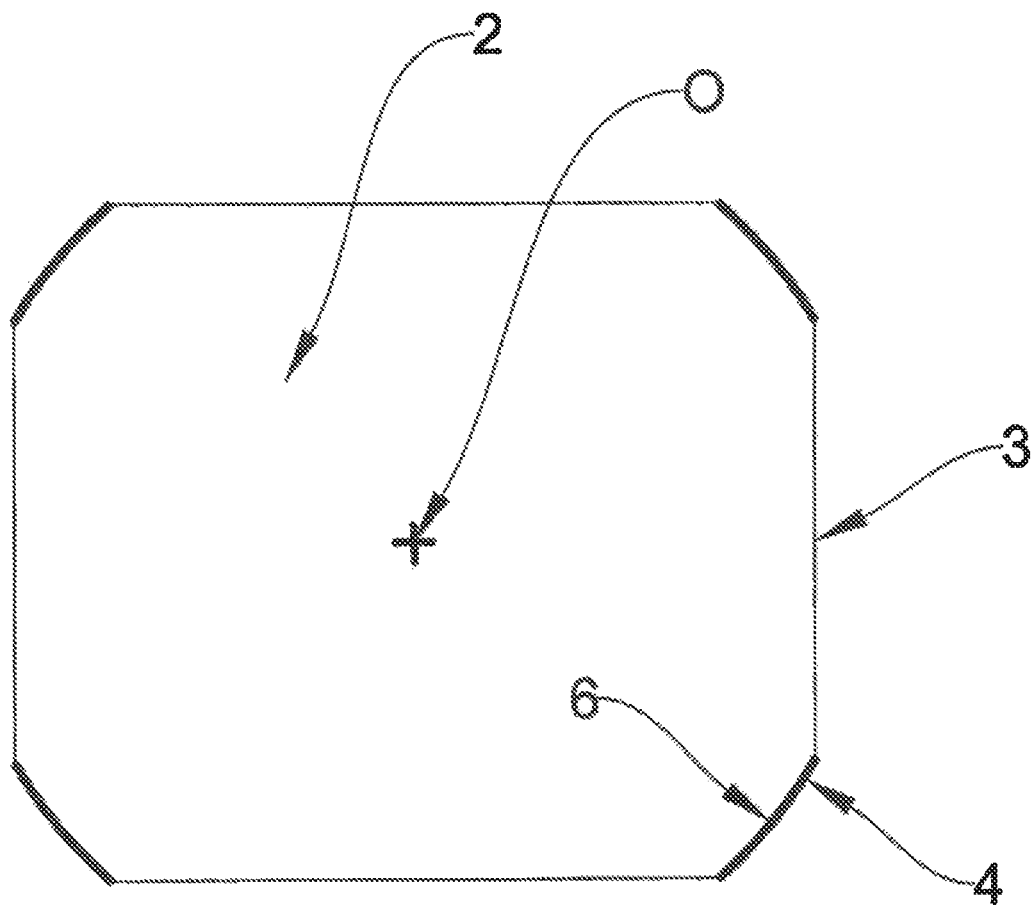
FIG. 2 a view showing the part produced from the ingot and having four straight sides and four arcuate portions each connecting two of the straight sides with one another.

The part 2 is then machined further in order to remove the four thin arcuate layers 6 shown in FIG. 2 of the drawings, so that in the finally produced part 2 the four arcuate surfaces each connecting two of the straight surfaces 3 with one another have a high quality and are concentric to a single center O.

Figure 3A:
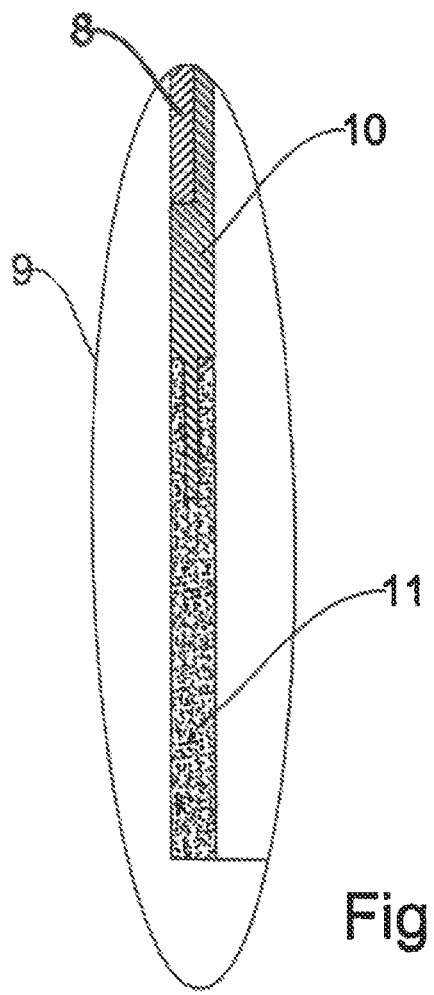
FIGS. 3a and 3b are views showing an abrasive tool for subsequent final machining of the parts produced from the ingots according to the present invention.
Figure 3:
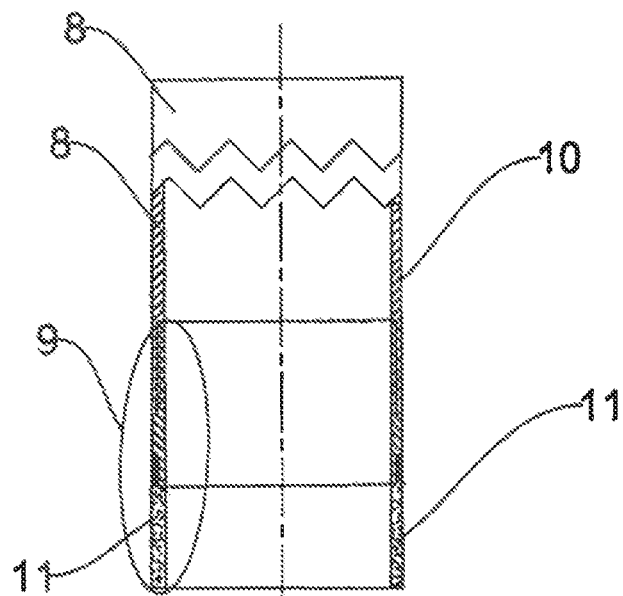

For machining of the part 2 an abrasive tool 7 shown in FIGS. 3*a* and 3*b* is provided. It has a hollow cylindrical housing 8 and a hollow cylindrical working portion 9 including a circular cylindrical holder 10 carrying a circular cylindrical abrasive working layer 11 provided with abrasive particles. The abrasive particles can be for example diamond abrasive particles.

In the abrasive tool 7 of the present invention the abrasive working portion 11 is concentric with respect to a central axis of the tool. Also in the abrasive tool of the present invention the circular cylindrical holder 10 is connected with the circular abrasive working layer 11 by introducing its end portion having a reduced thickness into a circular slot of the a circular cylindrical abrasive working layer 11.

According to the present invention the silicon elements are produced from the circular ingot 1 in the following manner.

First the circular segments 5 are removed from the ingot 1 in any know process, for example by cutting with conventional cuffing tools so as to produce the part 2. Then the rotatable abrasive tool 7 which has the circular abrasive working layer 11 is rotated strictly around the central axis O and is simultaneously displaced along the axis of the part 2 in contact with its outer surface. As a result the four thin arcuate layers 6 of the part 2 are removed and the underlying arcuate surfaces of the part 2 are finely machined by the abrasive working layer 11. The thusly produced final arcuate surfaces of the part 2 are exactly concentric to the center O.

Figure 4:
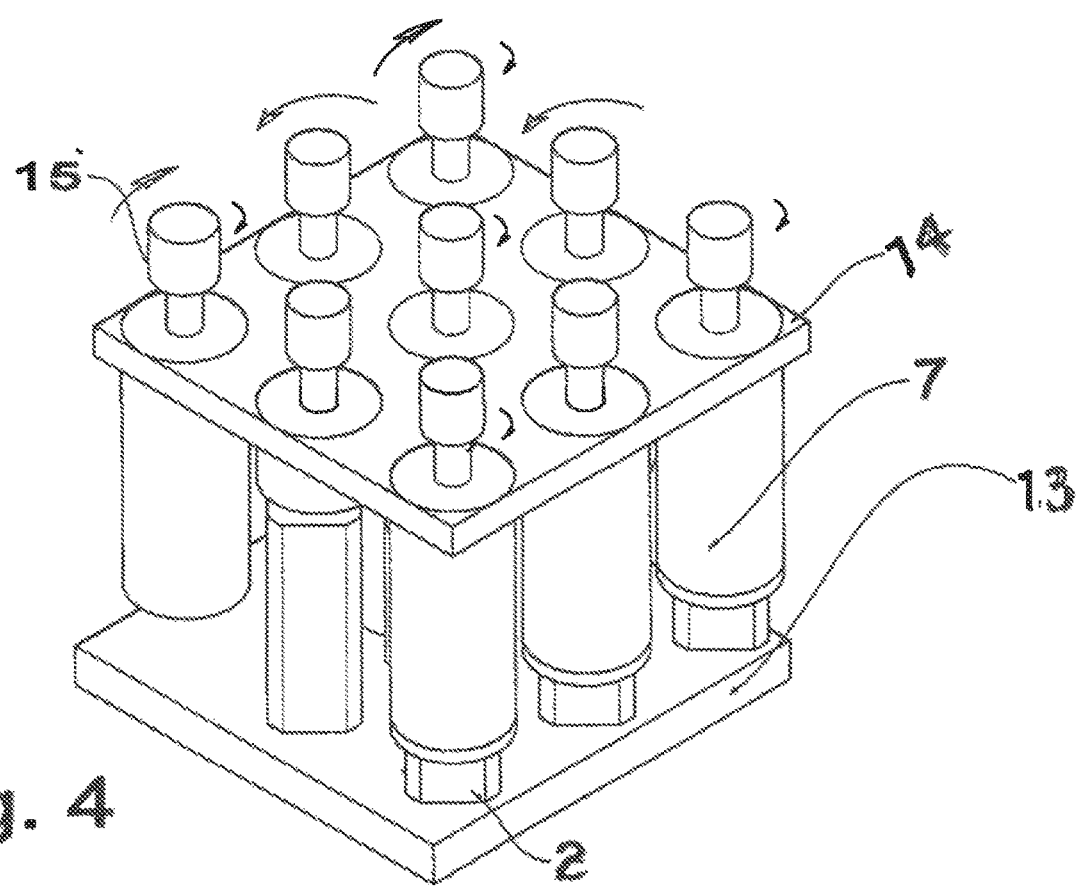
FIG. 4 is a view showing simultaneous machining of a plurality of the parts with a plurality of the tools according to the present invention.

Thereafter the thusly produced and finely machined part 2 is cut by known tools perpendicular to its axis with a plurality of parallel cuts which are perpendicular to its axis, and thereby a plurality of flat silicon elements are made. They can be used for example in solar panels or integrated circuits, FIG. 4 illustrates further novel features of the method according to the present invention. According to this further novel features a plurality of the parts 2 can be placed on a single support formed for example as a lower plate 13, and a plurality of abrasive tools 7 can be placed of a single support formed for example as an upper plate 14. When the tools 7 are rotated about their axes, for example by electric motors 15 which are shown in FIG. 4, a plurality of the parts are machined to obtain in each of them four above-mentioned high surface quality arcuate portions. Subsequently each of the parts 7 is cut transversely to produce a plurality of silicon elements, for example for solar panels or integrated circuits.

In accordance with the present invention some of the tools 7 can be rotated in one directions of rotation, while the other tools 7 can be rotated in another, opposite direction of rotation. This method allows to avoid a disbalance of the upper plate 14 carrying the tools 7, which can result in deviation of rotary axes of the tools 7 from the desired orientation and subsequently compromised geometry of the machined parts and silicon elements obtained from them.

Figure 5:
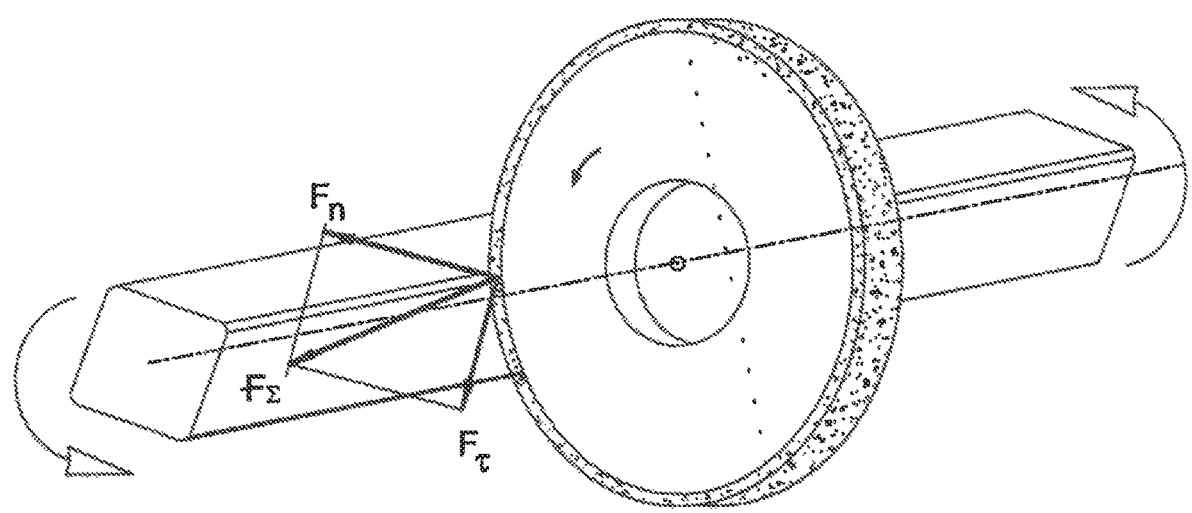
FIG. 5 is a view showing distribution of forces applied to a part produced from the ingot during the manufacturing process according to the prior art method.
Figure 6:
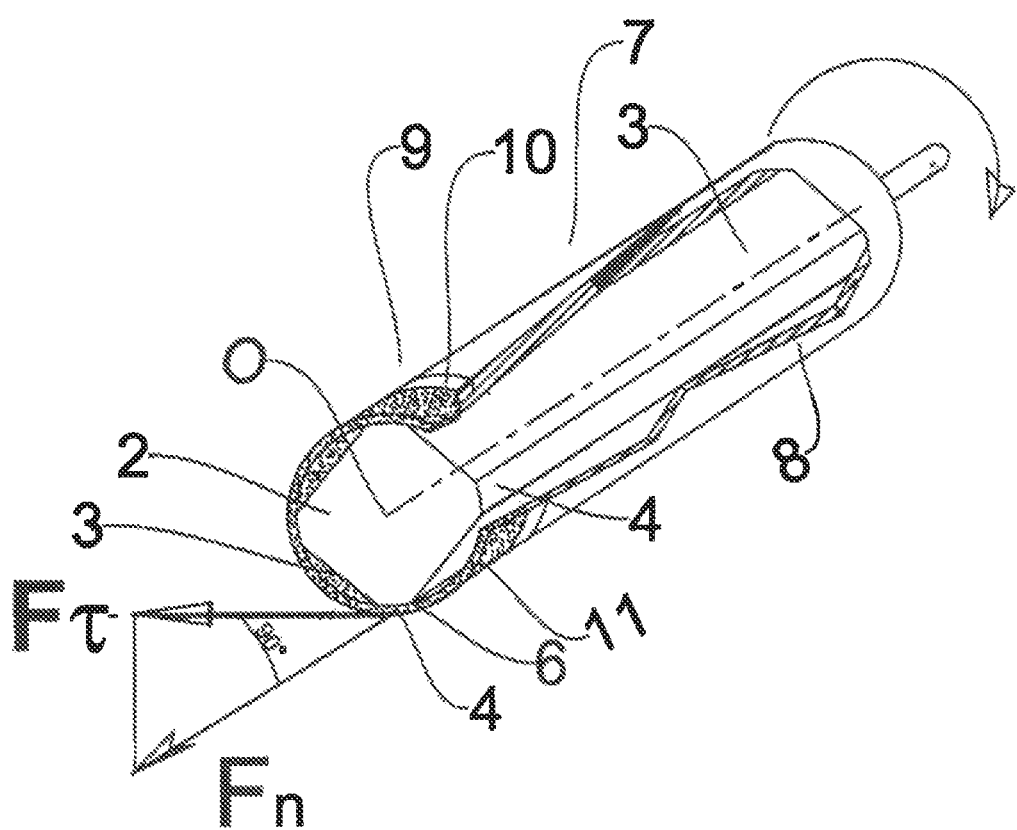
FIG. 6 is a view showing distribution of forces applied to a part produced from the ingot during the manufacturing process according to the method of the present invention.

FIG. 5 shows a distribution of forces applied to a part produced from the ingot during the manufacturing process according to the prior art method, while FIG. 6 shows distribution of forces applied to a part produced from the ingot during the manufacturing process according to the method of the present invention. As can be seen from FIG. 5 the normal component of a cuffing force in this process in the prior art is directed perpendicularly to an enveloping line and inwardly toward a center of the part. As a result, it creates damaged layers with microcracks which during subsequent thermal treatments can propagate toward a center of the part that cannot be used later.

In contrast In the method according to the present invention shown in FIG. 6, a normal component of a cutting force in the applicant's method is directed parallel to an enveloping curve of the part and not inwardly of the part, and as a result only very insignificant minimum destruction of the surface of the part takes place. This guarantees a high quality of the ingot that is ready to be cut into silicon elements, and as a result a high quality of the silicon elements.

The present invention is not limited to the details shown since various modification and structural changes can be made without departing from the spirit of the invention.

What is desired to be protected by Letters Patent is set in particular in the dependent claims.

The invention claimed is:

1. A method of manufacturing silicon elements, comprising the steps of
   producing from a circular ingot a part having a cross section with four straight skies and four arcuate portions each connecting two of the straight skies with one another;
   providing a rotatable abrasive tool which has a circular abrasive working layer composed of abrasive particles; and
   rotating the rotatable abrasive tool around a central axis of the part having a cross section with the four straight sides and the four arcuate portions each connecting two of the straight skies with one another, in contact with the four arcuate portions with simultaneous displacement of the tool along the central axis of the part such that the abrasive working layer removes outer layers of the four arcuate portions and machines the underlying arcuate surfaces; and
   subsequently cutting each part transversely to its axis to produce from each of the parts a plurality of silicon elements.

2. The method of claim 1, further comprising using as the rotatable abrasive tool a tool in which the abrasive working layer is concentric with respect to a central axis of the tool, and a circular cylindrical holder is connected with the abrasive working layer by introducing its end portion having a reduced thickness into a circular slot of the abrasive working layer.

3. The method of claim 1, further comprising arranging a plurality of said parts on a single support, arranging a plurality of the rotatable abrasive tools on a further single support; and rotating the plurality of the rotatable abrasive tools so as to provide the fine machining of the arcuate sides of all the parts arranged on the single support.

4. The method of claim 3, further comprising rotating some of the tools in one direction of rotation and rotating the other tools in an opposite directions so as to avoid disbalance of the further support of the tools and deviation of a desired orientation of the tools during machining of the parts.

5. The method of claim 1, further comprising performing the rotating the tool around a central axis of the part having a cross section with the four straight sides and the four arcuate portions each connecting two of the straight sides with one another, in contact with the four arcuate portions so that a normal component of a cutting force acts substantially tangential to an outer circumference of each portion.

\* \* \* \* \*